US009524891B2

United States Patent
You et al.

(10) Patent No.: US 9,524,891 B2
(45) Date of Patent: Dec. 20, 2016

(54) APPARATUS FOR FIXING METAL MASK

(71) Applicant: SAMSUNG DISPLAY CO., LTD., Yongin, Gyeonggi-Do (KR)

(72) Inventors: Suk-Beom You, Anyang-si (KR); Joo-Hwa Lee, Bucheon-si (KR)

(73) Assignee: SAMSUNG DISPLAY CO., LTD, Yongin, Gyeonggi-Do (KR)

(*) Notice: Subject to any disclaimer, the term of this patent is extended or adjusted under 35 U.S.C. 154(b) by 205 days.

(21) Appl. No.: 14/199,061

(22) Filed: Mar. 6, 2014

(65) Prior Publication Data
US 2015/0013599 A1    Jan. 15, 2015

(30) Foreign Application Priority Data
Jul. 9, 2013 (KR) .................. 10-2013-0080151

(51) Int. Cl.
*H01L 21/673* (2006.01)
*B05C 21/00* (2006.01)
*H01F 7/02* (2006.01)
*B05B 15/04* (2006.01)
*C23C 14/04* (2006.01)
*H01L 51/56* (2006.01)
*H01L 51/00* (2006.01)

(52) U.S. Cl.
CPC .......... *H01L 21/673* (2013.01); *B05B 15/045* (2013.01); *B05C 21/005* (2013.01); *C23C 14/042* (2013.01); *H01F 7/0252* (2013.01); *H01L 51/56* (2013.01); *H01L 51/0011* (2013.01)

(58) Field of Classification Search
CPC .. H01L 21/3081; H01L 21/682; H01L 21/673; C23C 14/042; C23C 14/50; C23C 16/042; B05C 21/005; H01F 7/0252
See application file for complete search history.

(56) References Cited

U.S. PATENT DOCUMENTS

| 4,492,180 | A | * | 1/1985 | Martin | C23C 14/042 101/126 |
|---|---|---|---|---|---|
| 4,777,909 | A | * | 10/1988 | Martin | C23C 14/042 118/720 |
| 5,107,238 | A | * | 4/1992 | Leupold | H01J 23/0873 315/5.35 |
| 5,729,330 | A | * | 3/1998 | Nishi | G03B 27/6242 355/75 |
| 2007/0006807 | A1 | * | 1/2007 | Manz | C23C 14/042 118/720 |

(Continued)

FOREIGN PATENT DOCUMENTS

| KR | 10-2003-0091563 | 3/2003 |
|---|---|---|
| KR | 10-2005-0091919 | 9/2005 |
| KR | 10-2009-0127288 | 12/2009 |

*Primary Examiner* — Karl Kurple
(74) *Attorney, Agent, or Firm* — F. Chau & Associates, LLC

(57) ABSTRACT

An apparatus for fixing a metal mask includes a first substrate, a magnet array structure, a second substrate, and a metal mask. The magnet array structure includes a plurality of magnets. The magnet array structure is disposed on the first substrate. The plurality of magnets includes their respective magnetic axes. The magnetic axes cross each other. The second substrate is disposed on the magnet array structure. The metal mask is disposed on the second substrate.

11 Claims, 4 Drawing Sheets

(56) References Cited

U.S. PATENT DOCUMENTS

| | | | | |
|---|---|---|---|---|
| 2007/0009671 | A1* | 1/2007 | Manz | C23C 14/042 427/468 |
| 2009/0277779 | A1* | 11/2009 | Sasaki | C23C 14/35 204/192.12 |
| 2009/0291610 | A1* | 11/2009 | Sasaki | C23C 14/042 445/24 |
| 2010/0112194 | A1* | 5/2010 | Inoue | C23C 14/042 427/66 |
| 2011/0059235 | A1* | 3/2011 | Fukushima | C23C 14/042 427/128 |
| 2011/0174217 | A1* | 7/2011 | Gersdorff | C23C 16/042 118/500 |
| 2013/0157016 | A1* | 6/2013 | Kim | C23C 14/24 428/172 |

* cited by examiner

APPARATUS FOR FIXING METAL MASK

CROSS REFERENCE TO RELATED APPLICATION

This application claims priority under 35 U.S.C. §119 to Korean Patent Application No. 10-2013-0080151 filed on Jul. 9, 2013, the disclosure of which is incorporated by reference herein in its entirety.

TECHNICAL FIELD

Exemplary embodiments of the inventive concept relate to fixing techniques using a magnet, and more specifically, to an apparatus for fixing a metal mask.

DISCUSSION OF THE RELATED ART

When a thin film is formed on a substrate during a process of manufacturing a semi-conductor element or an organic light emitting diode, a shadow mask having a predetermined opening is disposed between an evaporation source and the substrate after the substrate is fixed in a substrate holder. A thin film having a predetermined pattern is formed on the substrate by using, e.g., an evaporation method. The shadow mask and the substrate are fixed in the substrate holder when the thin film is manufactured in a chamber.

The substrate and the shadow mask may be fixed using a permanent magnet or an electro-magnet. In such case, magnetic fields generated by the magnet may be weakened and unevenly distributed.

SUMMARY

According to an exemplary embodiment of the inventive concept, an apparatus for fixing a metal mask includes a first substrate, a magnet array structure, a second substrate, a metal mask. The magnet array structure includes a plurality of magnets is disposed on the first substrate, magnets include a plurality of magnetic axes, respectively, the magnetic axes cross each other. The second substrate is disposed on the magnet array structure. The metal mask is disposed on the second substrate.

In an exemplary embodiment of the inventive concept, the magnet array structure may include a first magnet, a second magnet, a third magnet, a fourth magnet, and a fifth magnet that may be sequentially arranged on the first substrate.

In an exemplary embodiment of the inventive concept, a positive pole direction of the first magnet may be defined as a first direction, a positive pole direction of the second magnet may be defined as a the second direction which intersects the first direction, a positive pole direction of the third magnet may be defined as a third direction which intersects the second direction, a positive pole direction of the fourth magnet may be defined as a fourth direction which intersects the first direction and the second direction, and a positive pole direction of the fifth magnet may be defined as the first direction.

In an exemplary embodiment of the inventive concept, the magnet array structure may include the second magnet spaced apart from the first magnet in the fourth direction, the third magnet spaced apart from the second magnet in the fourth direction, the fourth magnet spaced apart from the third magnet in the fourth direction, and the fifth magnet spaced apart from the forth magnet in the fourth direction.

In an exemplary embodiment of the inventive concept, a distance between adjacent magnets may be substantially constant.

In an exemplary embodiment of the inventive concept, the direction of first magnetic force lines generated by the first, second, and third magnets may be opposite to the direction of second magnetic force lines generated by the second and fourth magnets. The first magnetic fields may be destructively interfered by the second magnetic force lines.

In an exemplary embodiment of the inventive concept, the direction of magnetic force lines generated by the first, second, and third magnets is substantially the same as the direction of magnetic force lines generated by the second, and fourth magnets.

In an exemplary embodiment of the inventive concept, the plurality of magnets may be positioned so that a combination of magnetic fields generated by the first, third, and fifth magnets provide a largest strength in the first direction.

In an exemplary embodiment of the inventive concept, the magnet array structure may include at least five magnets.

In an exemplary embodimen of the inventive concept, the second substrate and the metal mask may be attached on the magnet array structure by magnetic fields generated by the magnet array structure.

In an exemplary embodiment of the inventive concept, the first substrate and the metal mask may include a magnetic substance.

In an exemplary embodiment of the inventive concept, the metal mask may include a pattern region having a plurality of openings and a frame region contacting the second substrate.

In an exemplary embodiment of the inventive concept, a thin film is formed on the patterned region of the second substrate.

In an exemplary embodiment of the inventive concept, the magnet array structure may further include a second magnet, a third magnet, a fourth magnet, and a fifth magnet sequentially arranged adjacent to the magnet array structure.

In an exemplary embodiment of the inventive concept, the plurality of magnets has first magnets with magnetic axes substantially perpendicular to the first substrate, and second magnets with magnetic axes substantially parallel to the first substrate.

In an exemplary embodiment of the inventive concept, the first magnets and the second magnets may be alternately disposed on the first substrate.

In an exemplary embodiment of the inventive concept, the magnetic axes of the first magnets may be alternately disposed on the first substrate.

In an exemplary embodiment of the inventive concept, the magnetic axes of the second magnets may be alternately disposed on the first substrate.

In an exemplary embodiment of the inventive concept, an apparatus for fixing a metal mask comprises a first substrate, a plurality of magnets, a second substrate, and a metal mask. The plurality of magnets is disposed on the first substrate. The second substrate is disposed on the plurality of magnets. The metal mask is disposed on the second substrate. The plurality of magnets is arranged so that magnetic fields oriented toward the first substrate are canceled out, and magnetic fields oriented toward the second substrate are strengthened.

BRIEF DESCRIPTION OF THE DRAWINGS

Exemplary embodiments can be understood in more detail from the following description taken in conjunction with the accompanying drawings, in which.

DESCRIPTION OF EMBODIMENTS

Figure 1:
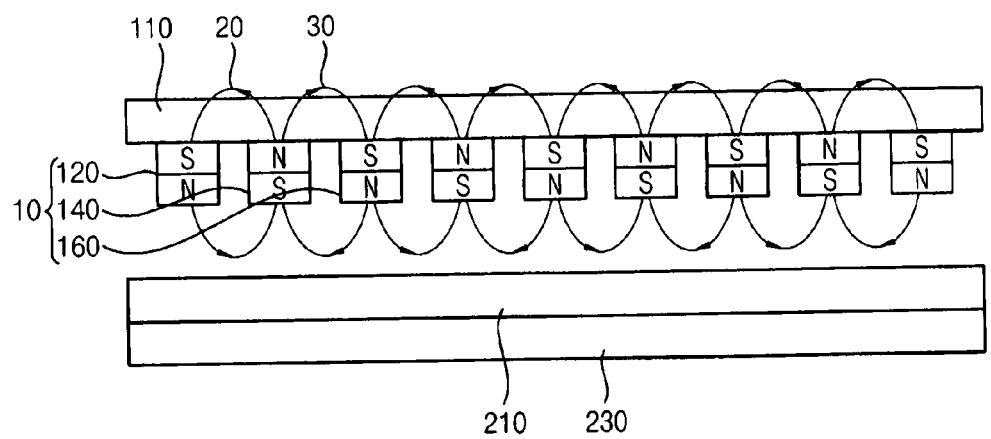
FIG. 1 is a cross-sectional view illustrating an apparatus for fixing a metal mask in accordance with an exemplary embodiment of the present invention.

The exemplary embodiments are described more fully hereinafter with reference to the accompanying drawings. The inventive concept may, however, be embodied in many different forms and should not be construed as limited to the exemplary embodiments set forth herein.

It will be understood that when an element or layer is referred to as being "on," "connected to" or "coupled to" another element or layer, it can be directly on, connected or coupled to the other element or layer or intervening elements or layers may be present. Like reference numerals may refer to like or similar elements throughout the specification and the drawings. As used herein, the singular forms "a," "an" and "the" are intended to include the plural forms as well, unless the context clearly indicates otherwise.

FIG. 1 is a cross-sectional view illustrating an apparatus for fixing a metal mask in accordance with an exemplary embodiment of the present invention.

Referring to FIG. 1, an apparatus for fixing a metal mask may include a first substrate 110, a magnet array structure 10, a second substrate 210, and a metal mask 230. The magnet array structure 10 may include a first magnet 120, a third magnet 140, and a fifth magnet 160. The first magnet 120, the third magnet 140, and the fifth magnet 160 may be disposed on the first substrate 110. The first magnet 120, the third magnet 140, and the fifth magnet 160 may be alternately disposed while spaced apart from each other. The second substrate 210 may be disposed on the magnet array structure 10, and the metal mask 230 may be disposed on the second substrate 210. The magnet array structure 10 may be sequentially arranged in the order of the first magnet 120, the third magnet 140, and the fifth magnet 160. In this case, the magnet array structure 10 may generate two magnetic force lines. For example, a magnetic force line 20 may be generated by the first magnet 120 and the third magnet 140, and a magnetic force line 30 may be generated by the third magnet 140 and the fifth magnet 160. The magnet array structure 10 may generate the magnetic force lines upwardly and downwardly substantially at the same time.

TABLE 1

| THICKNESS OF A MASK (μm) | ADHESIVE FORCE (N/m) |
| --- | --- |
| 50 | 3.36 |
| 40 | 2.21 |

TABLE 1-continued

| THICKNESS OF A MASK (μm) | ADHESIVE FORCE (N/m) |
| --- | --- |
| 30 | 1.43 |
| 20 | 0.81 |

Table 1 illustrates an adhesive force in accordance with a thickness of an apparatus for fixing a metal mask.

Referring to Table 1, an adhesive force of the magnet array structure 10, the second substrate 210, and the metal mask 230 that is disposed on the second substrate 210 in accordance with a thickness of an apparatus for fixing a metal mask 230 are illustrated. When an organic light emitting diode display of a high resolution is manufactured, an opening of the metal mask 230 is decreased. Accordingly, the thickness of the metal mask 230 is made thin to decrease a shadow phenomenon When the thickness of the metal mask 230 is thin, the adhesive force of the magnet array structure 10, the second substrate 210, and the metal mask 230 that is disposed on the second substrate 210 is decreased as shown in [Table 1] above. Substantially, when the thickness of the metal mask 230 is changed from about 50 μm to about 20 μm, the adhesive force of the magnet array structure 10, the second substrate 210, and the metal mask 230 that is disposed on the second substrate 210 is decreased to about one fourth of the adhesive force. When the thickness of the metal mask 230 is decreased, the apparatus for fixing a metal mask may have a magnet array structure having a larger adhesive force than the adhesive force of the magnet array structure 10.

Figure 2:
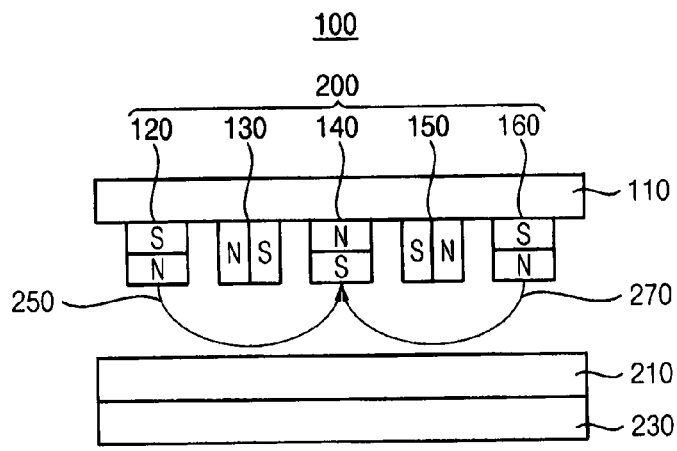
FIG. 2 is a cross-sectional view illustrating an apparatus for fixing a metal mask having a magnet array structure in accordance with an exemplary embodiment of the present invention.
Figure 2:
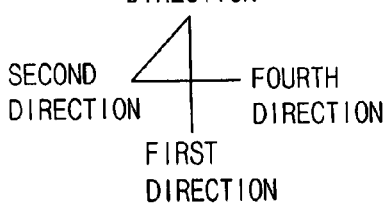

FIG. 2 is a cross-sectional view illustrating an apparatus for fixing a metal mask having a magnet array structure in accordance with an exemplary embodiment of the present invention.

Referring to FIG. 2, an apparatus 100 for fixing a metal mask may include a first substrate 110, a magnet array structure 200, a second substrate 210, and a metal mask 230.

The first substrate 110 may include a magnetic substance. For example, the first substrate 110 may include nickel (Ni) or SUS (Steel Use Stainless) having high corrosion resistance. A plurality of openings each having a rectangular shape may be disposed on the first substrate 110. A plurality of permanent magnets may be disposed in the plurality of openings, respectively.

The magnet array structure 200 may be disposed on the first substrate 110. The magnet array structure 200 may include five permanent magnets, such as a first magnet 120, a second magnet 130, a third magnet 140, a fourth magnet 150, and a fifth magnet 160.

The first magnet 120 may be disposed on the first substrate 110. A positive pole direction of the first magnet 120 may be defined as a first direction. The second magnet 130 may be disposed on the first substrate 110. The second magnet 130 may be spaced apart from the first magnet 120 in the forth direction. A positive pole direction of the second magnet 130 may be defined as the second direction. The third magnet 140 may be disposed on the first substrate 110. The third magnet 140 may be spaced apart from the second magnet 130 in the fourth direction. A positive pole direction of the third magnet 140 may be defined as a third direction. The fourth magnet 150 may be disposed on the first substrate 110. The fourth magnet 150 may be spaced apart the third magnet 140 in the fourth direction. A positive pole direction of the fourth magnet may be defined as the fourth direction. The fifth magnet 160 may be disposed on the first substrate 110. The fifth magnet 160 may be spaced apart from the forth magnet 150 in the fourth direction. A positive pole direction of the fifth magnet may be defined as the first direction. The first to fifth magnets 120 to 160 may include a plurality of magnetic axes, respectively, and the magnetic axes may be arranged to cross each other. A distance between adjacent magnets may be substantially constant. The magnet array structure 200 may include the magnetic axes of the magnets that are substantially perpendicular to the first substrate 110 and the magnet axes of the magnets that are substantially parallel to the first substrate 110. The magnets having the magnetic axis that are substantially perpendicular to the first substrate 110 and the magnets having the magnet axis that are substantially parallel to the first substrate 110 may be alternately disposed.

In this case, two magnetic force lines 250 and 270 may be generated. For example, the magnetic force line 250 may be formed from a positive pole of the first magnet 120 to a negative pole of the third magnet 140, and the magnetic force line 270 may be formed from a positive pole of the fifth magnet 160 to a negative pole of the third magnet 140. The magnetic force line 250 and the magnetic force lines 270 may generate magnetic force lines in the first direction. Thus, the magnet array structure 200 may include the at least five magnets to generate the magnetic force lines in the first direction.

The second substrate 210 may include a glass substrate, a quartz substrate, a polymer resin substrate, or the like. The second substrate 210 may be disposed on the magnet array structure 200. A thin film may be formed on the second substrate 210 by a pattern of the metal mask 230. The thin film might not be formed on both sides of the second substrate 210. The thin film may be disposed in a static space of the second substrate 210.

The metal mask 230 may be disposed on the second substrate 210. The metal mask 230 may include a magnetic substance. For example, the metal mask 230 may include invar, super-invar, nickel (Ni), an iron-nickel alloy, a high corrosion-resistant SUS or the like. The metal mask 230 may include a pattern region and a frame region. The pattern region may include a plurality of openings, and the frame region may contact the second substrate 210. For example, the pattern region may be formed of Ni, and the frame region may be formed of invar. The magnet array structure 200, the second substrate 210, and the metal mask 230 having the magnetic substance may be adhered by magnetic fields of the magnet array structure 200.

Figure 3:
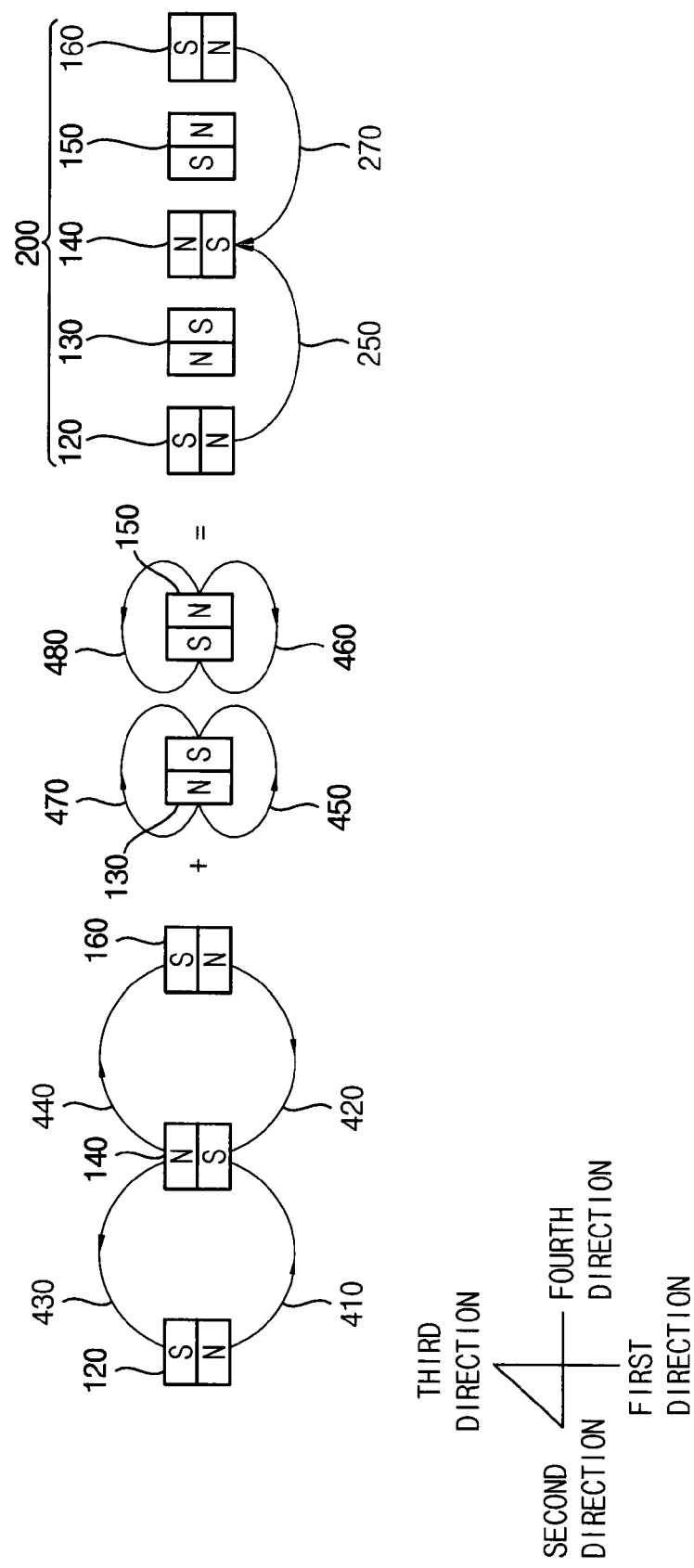
FIG. 3 is a cross-sectional view illustrating a magnet array structure of an apparatus for fixing a metal mask of FIG. 2, according to an exemplary embodiment of the present invention.

FIG. 3 is a cross-sectional view illustrating a magnet array structure of an apparatus for fixing a metal mask in accordance with an exemplary embodiment of the present invention.

Referring to FIG. 3, a process of generating a magnetic force line 250 and a magnetic force line 270 in the magnet array structure 200 is shown. A magnetic force line 410 may be generated from a positive pole of a first magnet 120 to a negative pole of a third magnet 140, and a magnetic force line 430 may be generated from a positive pole of the third magnet 140 to a negative pole of the first magnet 120. A magnetic force line 420 may be generated from a positive pole of a fifth magnet 160 to the negative pole of the third magnet 140, and a magnetic force line 440 may be generated from the positive pole of the third magnet 140 to a negative pole of the fifth magnet 160. The first magnet 120 and the fifth magnet 160 are substantially symmetric to each other with respect to the third magnet 140. In an exemplary embodiment of the present invention, the positive pole of the third magnet 140 may be disposed in a third direction. The positive pole of the first magnet 120 and the fifth magnet 160 may be disposed in a first direction.

A magnetic force line 450 and a magnetic force line 470 may be formed from a positive pole of a second magnet 130 to a negative pole of the second magnet 130. A magnetic force line 460 and a magnetic force line 480 may be formed from a positive pole of a fourth magnet 150 to a negative pole of the fourth magnet 150. The second magnet 130 and the fourth magnet 150 may be substantially symmetric to each other with respect to a virtual vertical line there between. In an exemplary embodiment of the present invention, the positive pole of the second magnet 130 may be disposed in a second direction, and the positive pole of the fourth magnet 150 may be disposed in a fourth direction.

Accordingly, the magnet array structure 200 may form magnetic force lines obtained by a combination of the magnetic force lines 410, 420, 430, and 440 generated by the first magnet 120, the third magnet 140, and fifth magnet 160 and the magnetic force lines 450, 460, 470, and 480 generated by the second magnet 130 and the fourth magnet 150. For example, a direction of the magnetic force line 430 may be opposite to a direction of magnetic force line 470. A direction of the magnetic force line 430 may be opposite to a direction of the magnetic force line 480. Thus, the magnetic force line 430 and the magnetic force line 470 may be destructively interfered with each other, and the magnetic force line 440 and magnetic force line 480 may be destructively interfered with each other.

A direction of the magnetic force line 410 and a direction of the magnetic force line 450 may be substantially identical to each other. The magnetic force line 420 and the magnetic force line 460 may be substantially identical to each other. Thus, the magnetic force line 410 and the magnetic force line 450 may be strengthened, and the magnetic force line 420 and the magnetic force line 460 may be strengthened. In an exemplary embodiment of the present invention, the magnets 120 to 160 may be positioned to maximize the strength of magnetic force lines obtained by a combination of the magnetic fields of the first and third magnets and a combination of the magnetic fields of the third and fifth magnets in the first direction.

Therefore, the magnet array structure 200 may form the magnetic force line 250 by a combination of the magnetic force lines 410 and 450 and the magnetic force line 270 by a combination of the magnetic force lines 420 and 460. The magnet array structure 200 may cancel out the magnetic fields oriented in the third direction and may strengthen the magnetic fields oriented in the first direction. Accordingly, when an apparatus for fixing a metal mask 100 includes the magnet array structure 200 that may reinforce magnetic fields oriented in the first direction, the adhesive force of the magnet array structure 200, the second substrate 210, and the metal mask 230 that is disposed on the second substrate 210 may be increased.

Figure 4:
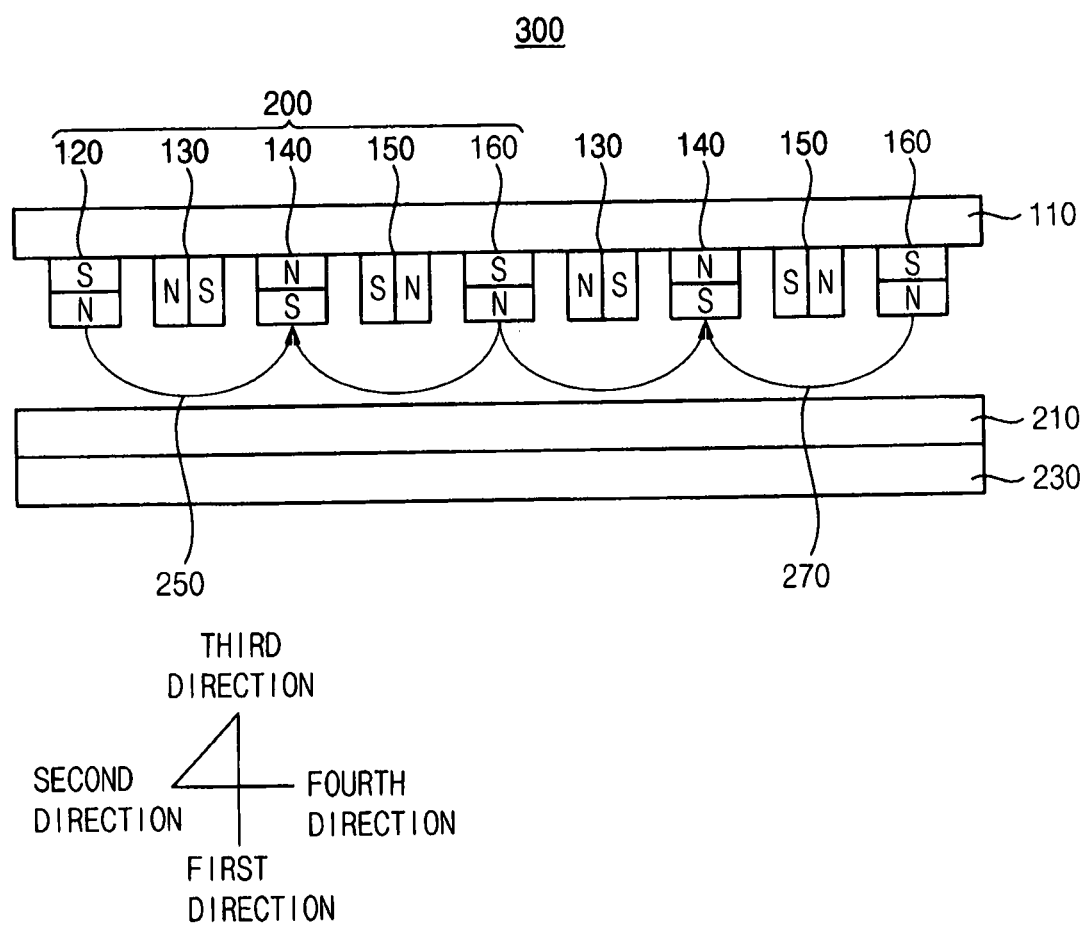
FIG. 4 is a cross-sectional view illustrating an apparatus for fixing a metal mask having a plurality of magnet array structures in accordance with an exemplary embodiment of the present invention.

FIG. 4 is a cross-sectional view illustrating an apparatus for fixing a metal mask having a plurality of magnet array structures in accordance with an exemplary embodiment of the present invention.

Referring to FIG. 4, an apparatus for fixing a metal mask 300 may include a first substrate 110, a magnet array structure 200, a second magnet 130, a third magnet 140, a fourth magnet 150, a fifth magnet 160, a second substrate 210, and a metal mask 230.

The first substrate 110 may include a magnetic substance. For example, the first substrate 110 may include nickel (Ni) or high corrosion-resistant SUS or the like.

A plurality of openings each having a rectangular shape may be disposed on the first substrate 110. A plurality of permanent magnets may be disposed in the plurality of openings, respectively.

The magnet array structure 200 may be disposed on the first substrate 110. The magnet array structure 200 may include five permanent magnets, such as a first magnet 120, a second magnet 130, a third magnet 140, a fourth magnet 150, and a fifth magnet 160.

The first magnet 120 may be disposed on the first substrate 110. A positive pole direction of the first magnet 120 may be defined as a first direction. The second magnet 130 may be disposed on the first substrate 110. The second magnet 130 may be spaced apart from the first magnet 120 in the fourth direction. A positive pole direction of the second magnet 130 may be defined as the second direction. The third magnet 140 may be disposed on the first substrate 110. The third magnet 140 may be spaced apart from the second magnet 130 in the fourth direction. A positive pole direction of the third magnet 140 may be defined as a third direction. The fourth magnet 150 may be disposed on the first substrate 110. The fourth magnet 150 may be spaced apart from the third magnet 140 in the fourth direction. A positive pole direction of the fourth magnet 150 may be defined as the fourth direction. The fifth magnet 160 may be disposed on the first substrate 110. The fifth magnet 160 may be spaced apart from the fourth magnet 150 in the fourth direction. A positive pole direction of the fifth magnet 160 may be defined as the first direction. The magnets 120 to 160 may include a plurality of magnetic axes, respectively, that may cross each other. A distance between adjacent magnets may be substantially constant. The magnet array structure 200 may include the magnets having the magnetic axis that is substantially perpendicular to the first substrate 110 and the magnets having the magnet axis that is substantially parallel to the first substrate 110. The magnets having the magnetic axis that is substantially perpendicular to the first substrate 110 and the magnets having the magnet axis that is substantially parallel to the first substrate 110 are alternately may be disposed.

In this case, two magnetic force lines 250 and 270 may be generated. For example, the magnetic force line 250 may be formed from a positive pole of the first magnet 120 to a negative pole of the third magnet 140, and the magnetic force line 270 may be formed from a positive pole of the fifth magnet 160 to a negative pole of the third magnet 140. The magnetic force line 250 and the magnetic force line 270 may generate magnetic force lines in the first direction. The magnet array structure 200 may include at least five magnets (e.g., the first to fifth magnets 120 to 160) to generate magnetic force lines in the first direction.

An extra second magnet 130, an extra third magnet 140, an extra fourth magnet 150, and an extra fifth magnet 160 may be spaced apart from each other in the fourth direction of the magnet array structure 200. The fifth magnet 160 of the magnet array structure 200 and the extra second magnet 130, the extra third magnet 140, the extra fourth magnet 150, and the extra fifth magnet 160 may form another magnet array structure (also referred to a second magnet array structure). In the second magnet array structure, the fifth magnet 160 of the magnet array structure 200 may function like the first magnet 120 of the magnet array structure 200.

Thus, the second magnet array structure that includes the fifth magnet 160 of the magnet array structure 200, the extra second magnet 130, the extra third magnet 140, the extra fourth magnet 150, and the extra fifth magnet 160 may generate substantially the same magnetic force lines as the magnet array structure 200. In an exemplary embodiment of the present invention, when the length of the first substrate 110, the second substrate 210, and the metal mask 230 is increased, more magnet sets each including, e.g., an extra second magnet 130, an extra third magnet 140, an extra fourth magnet 150, and an extra fifth magnet 160 may be disposed on the first substrate 110 in the fourth direction, spaced apart from the magnet array structure 200. In an exemplary embodiment, the magnets 120 to 160 may be positioned to maximize the strength of magnetic fields obtained by a combination of the magnetic fields of the first and third magnets 120 to 140 and a combination of the magnetic fields of the third and fifth magnets 140 to 160 in the first direction.

The second substrate 210 may include a glass substrate, a quartz substrate, a polymer resin substrate, or the like. The second substrate 210 may be disposed on the magnet array structure 200. A thin film may be formed on the second substrate 210 by a pattern of the metal mask 230. The thin film might not be formed on both sides of the second substrate 210. The thin film may be disposed in a static space of the second substrate 210.

The metal mask 230 may be disposed on the second substrate 210. The metal mask 230 may include a magnetic substance. For example, the metal mask 230 may include invar, super-invar, nickel (Ni), an iron-nickel alloy, a high corrosion-resistant SUS or the like. The metal mask 230 may include a pattern region and a frame region. The pattern region may include a plurality of openings, and the frame region may contact the second substrate 210. For example, the pattern region may be formed of Ni, and the frame region may be formed of invar. The magnet array structure 200, the second substrate 210, and the metal mask 230 having the magnetic substance may be adhered by magnetic fields generated by the magnet array structure 200.

Figure 5:
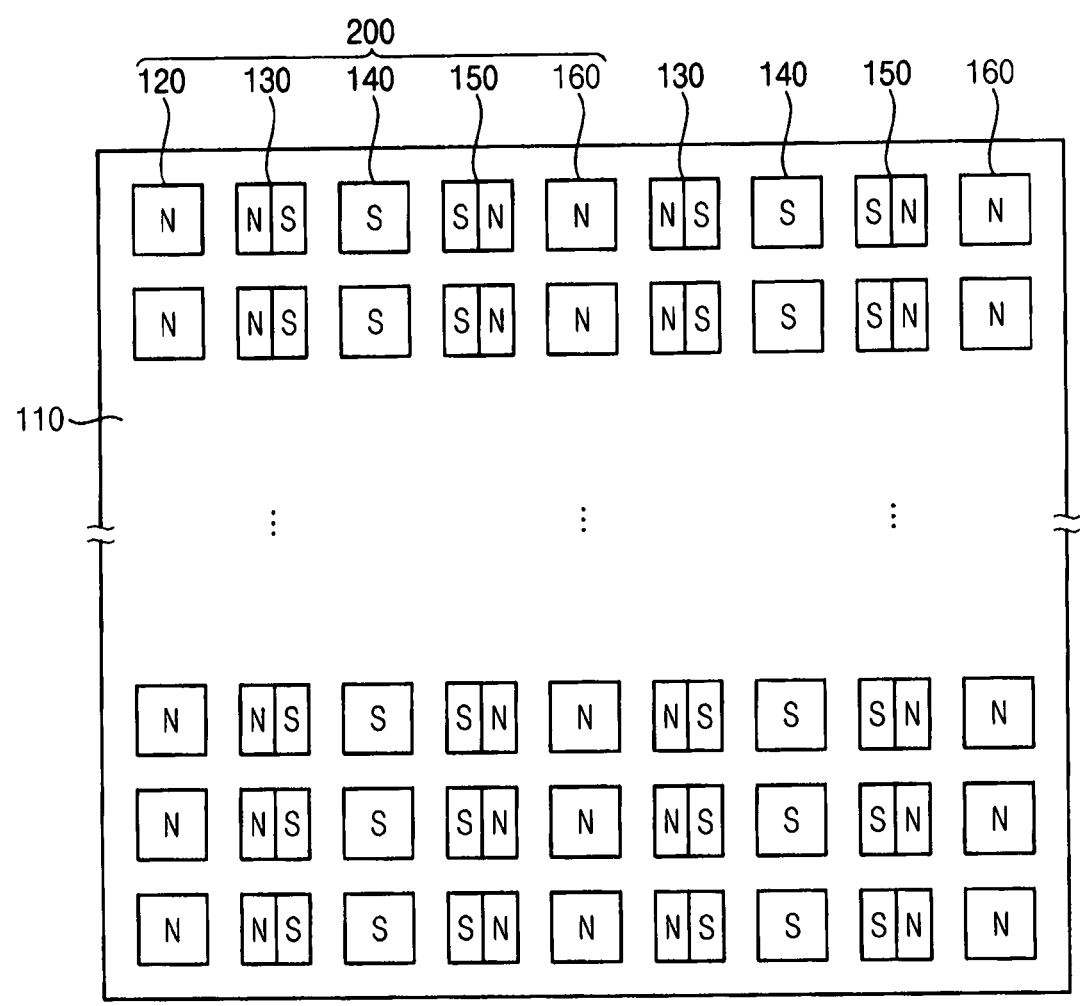
FIG. 5 is a plane view illustrating an apparatus for fixing a metal mask of FIG. 4, according to an exemplary embodiment of the present invention.

FIG. 5 is a plan view illustrating an apparatus for fixing a metal mask in accordance with an exemplary embodiment of the present invention.

Referring to FIG. 5, a magnet array structure 200 may include a first magnet 120, a second magnet 130, a third magnet 140, a fourth magnet 150, and a fifth magnet 160. Negative poles of the first magnet 120 and the fifth magnet 160 may contact the first substrate 110. A positive pole of the third magnet 140 may contact the first substrate 110. Positive poles and negative poles of the second magnet 130 and the fourth magnet 150 may contact the first substrate 110.

Referring again to FIG. 5, each row of the magnet array structure 200, an extra second magnet 130, an extra third magnet 140, an extra fourth magnet 150, and an extra fifth magnet 160 may have substantially the same pattern along the column direction. In an exemplary embodiment of the present invention, when a horizontal length of the first substrate 110 is increased, more sets each including an extra second magnet 130, an extra third magnet 140, an extra fourth magnet 150, and an extra fifth magnets 160 may be positioned adjacent to the magnet array structure 200 in the horizontal direction of the first substrate 110.

TABLE 2

| | ADHESIVE FORCE (N/m) | |
|---|---|---|
| | A | B |
| FIRST SUBSTRATE | 7.5 | 221 |
| WITHOUT FIRST SUBSTRATE | 10.3 | 220 |

Table 2 illustrates adhesive forces generated by metal mask fixing apparatuses as shown in FIG. 1 and FIG. 4.

Referring to Table 2, A refers to when a distance between a magnet array structure 10 and a metal mask 230 is about 13 mm, and B refers to when a distance between a magnet array structure 200 and a metal mask 230 is about 13 mm. The first substrate 110 may include a magnetic substance, for example. When the first substrate 110 is magnetized, the adhesive force may be influenced.

Table 2 shows that the adhesive force of the magnet array structure 200 is about 20 times increased than the adhesive force of the magnet array structure 10. In an exemplary embodiment of the present invention, increasing the thickness of the second substrate 210 or adjusting the distance between magnets may increase the adhesive force, and damage to the second substrate 210 and the metal mask 230 may be prevented.

An exemplary embodiment of the present invention may be applicable to a system having an apparatus for fixing a metal mask using a magnet array structure. For example, an exemplary embodiment of the present invention may be applicable to a mobile phone, a smart phone, a laptop computer, a tablet computer, a personal digital assistant (PDA), a portable multimedia player (PMP), a digital camera, a music player, a portable game console, a navigation system, or the like.

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A system including an apparatus configured to fix a metal mask between an evaporation source and a substrate, the apparatus comprising:
a first substrate;
a magnet array structure including a plurality of magnets disposed on the first substrate, the plurality of magnets including a plurality of magnetic axes, respectively, the plurality of magnetic axes crossing each other;
a second substrate disposed on the magnet array structure; and
a metal mask disposed on the second substrate, said metal mask comprises a patterned region having a plurality of openings and a frame region contacting the second substrate,
wherein an upper surface of the magnet array structure is in direct contact with the first substrate, and the second substrate is disposed between a lower surface of the magnet array structure and the metal mask,
wherein the magnet array structure comprises a first magnet, a second magnet, a third magnet, a fourth magnet, and a fifth magnet sequentially arranged on the first substrate,
wherein a positive pole direction of the first magnet is defined as a first direction, a positive pole direction of the second magnet is defined as a second direction which intersects the first direction, a positive pole direction of the third magnet is defined as a third direction which intersects the second direction, a positive pole direction of the fourth magnet is defined as a fourth direction which intersects the first direction and the second direction, and a positive pole direction of the fifth magnet is defined as the first direction,
wherein the first, third, and fifth magnets each have a magnetic axis perpendicular to a planar surface of the first substrate, the planar surface of the first substrate facing the first, second, third, fourth and fifth magnets, and wherein the second and fourth magnets having a magnetic axis parallel to the planar surface of the first substrate,
and said system is configured to form a thin film on a patterned region of the second substrate.

2. The apparatus of claim 1, wherein the second magnet is spaced apart from the first magnet in the fourth direction, the third magnet is spaced apart from the second magnet in the fourth direction, the fourth magnet is spaced apart from the third magnet in the fourth direction, and the fifth magnet is spaced apart from the fourth magnet in the fourth direction.

3. The apparatus of claim 1, wherein a distance between adjacent magnets is constant.

4. The apparatus of claim 1, wherein a direction of first magnetic force lines generated by the first, second and third magnets is opposite to a direction of second magnetic force lines generated by the second and fourth magnets, and wherein the first magnetic fields are destructively interfered by the second magnetic force lines.

5. The apparatus of claim 1, wherein a direction of magnetic force lines generated by the first, second and third magnets is the same as a direction of magnetic force lines generated by the second and fourth magnets.

6. The apparatus of claim 1, wherein the plurality of magnets is positioned so that a combination of magnetic fields generated by the first, third, and fifth magnets provide a largest strength in the first direction.

7. The apparatus of claim 1, wherein the magnet array structure comprises more than five magnets.

8. The apparatus of claim 1, wherein the second substrate and the metal mask are attached on the magnet array structure by magnetic fields generated by the magnet array structure.

9. The apparatus of claim 1, wherein the first substrate and the metal mask comprise a magnetic substance.

10. The apparatus of claim 1, wherein the plurality of magnets has first magnets with magnetic axes perpendicular to the first substrate and second magnets with magnetic axes parallel to the first substrate.

11. The apparatus of claim 10, wherein the first magnets and the second magnets are disposed on the first substrate alternately with respect to each other.

* * * * *